(12) United States Patent
Schlenga et al.

(10) Patent No.: US 11,264,150 B2
(45) Date of Patent: Mar. 1, 2022

(54) METHOD FOR PRODUCING AN AT LEAST TWO-PART STRUCTURE, IN PARTICULAR A SEMIFINISHED PRODUCT FOR A SUPERCONDUCTING WIRE

(71) Applicant: Bruker EAS GmbH, Hanau (DE)

(72) Inventors: Klaus Schlenga, Karlsruhe (DE); Vital Abaecherli, Erlensee (DE); Bernd Sailer, Alzenau (DE); Manfred Thoener, Biebergemuend (DE); Matheus Wanior, Gelnhausen (DE)

(73) Assignee: BRUKER EAS GMBH, Hanau (DE)

( * ) Notice: Subject to any disclaimer, the term of this patent is extended or adjusted under 35 U.S.C. 154(b) by 911 days.

(21) Appl. No.: 15/877,936

(22) Filed: Jan. 23, 2018

(65) Prior Publication Data
US 2018/0211747 A1   Jul. 26, 2018

(30) Foreign Application Priority Data

Jan. 23, 2017   (DE) .......................... 102017201035.5

(51) Int. Cl.
| *H01B 12/04* | (2006.01) |
| *H01L 39/24* | (2006.01) |
| *H01L 39/12* | (2006.01) |
| *B33Y 10/00* | (2015.01) |

(52) U.S. Cl.
CPC ............. *H01B 12/04* (2013.01); *H01L 39/12* (2013.01); *H01L 39/2406* (2013.01); *B33Y 10/00* (2014.12)

(58) Field of Classification Search
CPC ....................................................... H01B 12/04
See application file for complete search history.

(56) References Cited

U.S. PATENT DOCUMENTS

| 5,501,746 A | * | 3/1996 | Egawa | ................ H01L 39/2403 148/98 |
| 8,790,476 B2 | | 6/2014 | Kaltenborn et al. | |
| 9,023,765 B1 | | 5/2015 | Rimmer et al. | |
| 10,245,681 B2 | | 4/2019 | Koerber | |
| 2014/0296961 A1 | * | 10/2014 | Blaser | .................... A61F 2/915 623/1.12 |

(Continued)

FOREIGN PATENT DOCUMENTS

| CN | 101268533 A | 9/2008 |
| CN | 105324199 A | 2/2016 |

(Continued)

OTHER PUBLICATIONS

U.S. Appl. No. 62/374,212 provisional application. (Year: 2016).*

(Continued)

*Primary Examiner* — Paul A Wartalowicz
(74) *Attorney, Agent, or Firm* — Edell, Shapiro & Finnan LLC

(57) ABSTRACT

A method for producing an at least two-part structure, such as a semifinished product for a superconducting wire is provided. A first structure and a second structure are separately produced, and the first structure and the second structure are then inserted one into the other. The first structure and the second structure are respectively produced in layers by selective laser melting or selective electron beam melting of a powder. The method produces two-part structures for semifinished products of superconducting wires.

19 Claims, 5 Drawing Sheets

(56) References Cited

U.S. PATENT DOCUMENTS

| | | | | |
|---|---|---|---|---|
| 2015/0018218 A1* | 1/2015 | Lakrimi | ............... | H01F 6/008 |
| | | | | 505/163 |
| 2016/0018267 A1* | 1/2016 | Timofeev | ............... | H01L 37/00 |
| | | | | 250/336.2 |
| 2016/0136891 A1* | 5/2016 | Benthien | ............... | B22F 10/00 |
| | | | | 428/174 |
| 2018/0043437 A1* | 2/2018 | Finnerty | ............... | B22F 9/28 |

FOREIGN PATENT DOCUMENTS

| | | |
|---|---|---|
| DE | 1483365 A1 | 9/1969 |
| DE | 10051893 C2 | 8/2002 |
| DE | 202012102334 U1 | 7/2012 |
| DE | 102014224442 A1 | 6/2016 |
| EP | 1800700 A2 | 6/2007 |
| EP | 2719484 A1 | 4/2014 |
| GB | 1097418 | 1/1968 |
| JP | 2000190086 A | 7/2000 |
| JP | 2002-249805 A | 9/2002 |
| JP | 2009231201 A | 10/2009 |

OTHER PUBLICATIONS http://netzkonstrukteur.de/fertigungstechnik/3d-druck/selektives-laserschmelzen/ retrieved from internet Jul. 6, 2016 (in German language).

http://netzkonstrukteur.de/fertigungstechnik/3d-druck/selektives-elektronenstrahlschmelzen/ retrieved from internet Nov. 22, 2016 (in German language).

Terrazas, C.A. et al., "EBM Fabrication and Characterization of High Purity Niobium for Superconductor Applications", 25th Annual International Solid Freeform Fabrication Symposium, 2014, htthps://sffsymposium.engr.utexas.edu/2014TOC, retrieved from internet Oct. 25, 2017.

"Exploring superconducting properties of 3-D printed parts" Jul. 18, 2016; https://phys.org/news/2016-07-exploring-superconducting-properites-d.html; retrieved from internet Oct. 25, 2017.

\* cited by examiner

METHOD FOR PRODUCING AN AT LEAST TWO-PART STRUCTURE, IN PARTICULAR A SEMIFINISHED PRODUCT FOR A SUPERCONDUCTING WIRE

CROSS REFERENCE TO RELATED APPLICATIONS

The following disclosure is based on and claims the benefit of and priority under 35 U.S.C. § 119(a) to German Patent Application No. 102017201035.5, filed Jan. 23, 2017, and the disclosure of which is incorporated in its entirety into the present application by reference.

FIELD OF THE INVENTION

The invention relates to a method for producing at least a two-part structure, such as a semifinished product for a superconducting wire, wherein a first structure and a second structure are produced separately, and the first structure and the second structure are then inserted one into the other.

BACKGROUND

Superconducting wires, such as NbTi superconducting wires, for example, are used to conduct high electric currents with virtually no dissipation loss, particularly in superconducting magnetic coils for generating strong magnetic fields. In this case, NbTi has the advantage of favorable ductility, which facilitates processing of the material; for example, favorable plastic deformation is possible.

Superconducting materials such as NbTi are superconducting only below a critical temperature (also referred to as the transition temperature) and must therefore be cooled during operation, for example, with liquid helium. In many applications, filaments of superconducting material are provided that are arranged in a normally conductive matrix, often composed of copper. The matrix material should show favorable thermal conductivity so as to ensure cooling of the superconducting filaments, as well as favorable electrical conductivity (at the transition temperature), so that in the event of a local loss of superconductivity (quench), a substitute current path is available in order to protect the superconducting wire from burnout.

For introduction of superconducting filaments into a matrix, a method is known for introducing one or a plurality of rod-shaped elements composed of NbTi (or containing NbTi) into a block of a matrix material (for example, copper) in which deep holes have been bored, for example, DE 202012102334 U1. The filled matrix block, which can also be referred to as a semifinished product, is finally drawn into a wire, ordinarily after further construction and one or a plurality of intermediate bundling steps.

Deep hole boring becomes increasingly difficult for narrower and deeper bore holes, so that repeated bundling and drawing is generally required in order to arrange superconducting filaments in the desired number and with the desired diameter in a superconducting wire. This results in considerable expense during production.

Another special factor in the production of NbTi-containing elements is the requirement of rapid cooling in production of the NbTi-containing elements in order to prevent the formation of an undesirable α phase. Quenching makes it possible to freeze a more favorable ductile β phase, but this makes the NbTi-containing elements expensive.

In order to produce metallic components based on CAD data, another method has become known for producing a component in layers by local melting of a metal powder with a laser beam or electron beam ("selective laser melting" or "selective electron beam melting"), for example, the web page http://netzkonstrukteur.de/fertigungstechnik/3d-druck/selectives-laserschmelzen/, or the web page http://netzkonstrukteur.de/fertigungstechnik/3d-druck/selectives-elektronenstrahlschmelzen/. This production method requires no negative molds and allows undercuts.

SUMMARY

The object of the invention is to simplify the production of two-part structures, in particular for semifinished products of superconducting wires.

This object is achieved by using a method of the above-mentioned type, wherein the first structure and the second structure respectively are produced in layers by selective laser melting or selective electron beam melting of a powder.

The layered production of the two (partial) structures by selective laser melting or selective electron beam melting respectively makes it possible to use high aspect ratios in one or preferably both structures, which would be impossible or extremely difficult to achieve by mechanical methods such as deep hole boring or turning off.

In addition, the at least two structures are assembled into one only after having been individually produced, so that during the respective production process of the individual structures, only one powder material at a time is required or processed; this prevents cross-contamination of the materials of the first and second structures. However, the assembled overall structure can then combine a plurality of various materials, i.e. the materials of the first and second structures, and optionally further (partial) structures, without problems. In this manner, it is possible to easily produce overall structures such as those required for semifinished products of electrical conducting wires, such as superconducting wires.

NbTi elements (as a second structure or parts of a second structure) are introduced into a Cu block (as a first structure), wherein because of a high aspect ratio (and with a sufficiently high number of NbTi elements of the second structure), the number of intermediate bundling steps until the NbTi-containing superconducting wire is finished can be reduced. By means of separate production of the first and second structures, any introduction (contamination) of NbTi in the Cu block can as a rule be avoided without problems, thus ensuring a high residual resistance ratio (RRR) in the Cu phase. In addition, layered production by laser melting or electron beam melting is generally accompanied by relatively rapid material cooling, so that formation of the undesirable α phase in the NbTi material system is inherently prevented (i.e., without additional effort or cost).

It should be noted that the invention can also be used for other material systems, such as non-superconducting composite systems (such as Al/Cu).

Typically, the first structure is produced in a first 3D printer (of a first apparatus), and the second structure is produced in a second 3D printer (of a second apparatus), if desired parallel (simultaneously) to each other. Alternatively, the first structure and the second structure can also be produced successively in the same 3D printer (apparatus). It is also possible to produce the first structure by selective laser melting and the second structure by selective electron beam melting, or vice versa.

The first structure and the second structure typically behave as positive and negative components with respect to each other, so that no cavities remain in the interior after assembly (except for the clearance required for insertion of the structures into each other). Alternatively, further partial structures (in addition to the first and second structures) can also be assembled into the overall structure, typically in such a manner that there are no remaining cavities. The structures are typically inserted into each other by sliding into each other along an axial direction.

The layered production of a structure by selective laser melting or selective electron beam melting has become known in the context of additive production (additive manufacturing) or 3D printing. In this process, an area is provided in each layer that is passed over by the laser beam or electron beam and thus locally melted so that the powder grains in this area are bonded to one another (the "laser-irradiated area" or "electron-beam-irradiated area", also known as the "irradiated area"). The laser-irradiated or electron-beam-irradiated area can also comprise a plurality of unlinked partial areas. In addition, in general, another area of a respective layer is not passed over by the laser beam or electron beam, so that the powder grains in this area are not bonded to one another (the "non-irradiated area"). This non-irradiated area can also comprise a plurality of unlinked partial areas. A plurality of layers is produced one after the other and one atop the other, usually 100 layers or more, wherein in each layer, the respective laser-irradiated or electron-beam-irradiated area is solidified. After production of all of the layers, the remaining powder is removed, and the finished structure is obtained.

A first or second structure typically has a total axial length of between 30 cm and 1.50 m, or between 50 cm and 1 m, and further typically has a total diameter of between 5 cm and 50 cm, or between 10 cm and 25 cm. A typical first or second structure typically has a constant external diameter along an axial direction (optionally with the exception of an end plate, which is typically removed after sliding the two structures into each other).

In the method provided according to embodiments of the invention, the first structure and the second structure are produced from different materials. In this manner, it is possible to obtain an overall structure that is produced by means of layered production by laser melting or electron beam melting and also combines different materials in this process. Assembly of the two structures after separate production makes it possible to combine the two materials without requiring that two powder materials be processed in a layered manner on a single structure simultaneously. In this embodiment, the powders from which the first structure and the second structure are produced have correspondingly different compositions; typically, one of the powders contains a superconducting material (composed of the components to be melted for this material) and the other powder contains a normally conductive material (composed of the components to be melted for this material).

In another variant, the first structure is produced with a plurality of axial recesses and the second structure is produced with a plurality of diametrically opposed axial extensions. Using this variant, it is possible to produce zones (substructures) extending in an axial direction that have properties different from those of a surrounding matrix, in particular at high aspect ratios. More particularly, the axial extensions can be used as superconducting filaments in a normally conductive matrix. The recesses or extensions typically extend through the entire axial length of the respective structure, optionally with the exception of an end plate.

In another variant, the first structure is produced with at least 7, or at least 19, axial recesses and the second structure is produced with at least 7, or at least 19, diametrically opposed axial extensions. In another variant, at least 6 recesses or extensions can be provided. Because of the large number of recesses or extensions, production becomes particularly efficient; the number of recesses or extensions has no effect or a negligible effect on the duration of production of a respective layer. Typically, the axial recesses are identical to one another, and the axial extensions are also identical to one another.

Particularly preferred is an improvement in which the axial extensions of the second structure have an extensions-aspect ratio FAV of at least 20. The extensions-aspect ratio of the second structure is described by the quotients of the axial length divided by the major diameter (transverse to the axial direction) of an extension. These aspect ratios are easy to produce by the method according to embodiments of the invention, in contrast to mechanical methods.

In other aspects, an axial projection area of the first structure in which the axial recesses are formed has a projections-aspect ratio SAV of at least 20. The projections-aspect ratio is described by the quotients of the axial length of the projection area divided by the smallest distance ("projection width") (transverse to the axial direction) between adjacent recesses in the projection area, measured between the opposing boundaries of the recesses. These aspect ratios are also easy to produce by the method according to embodiments of the invention, in contrast to mechanical methods.

In other embodiments, the first structure and the second structure are produced layered along a direction perpendicular to the direction of axial extension of the axial recesses and the axial extensions. In this manner, any planar defects (such as non-superconducting areas) produced between two layers are oriented parallel to the longitudinal direction and thus parallel to the usual current flow direction of a conducting wire, and therefore, have only a minor influence on the current-carrying capacity. Accordingly, particularly high current-carrying capacities of a finished NbTi superconducting wire are possible with this process. It should be noted that for this embodiment, the pulverulent material and the laser beam or electron beam is distributed or guided over a relatively long distance or a large production area; however, only a minimal lifting height of the structural platform is needed. It is also possible, independently of the axial extensions and recesses, to produce the first structures and the second structures layered perpendicularly to the direction of axial extension.

In another variant, the first structure and the second structure are produced layered along the direction of axial extension of the axial recesses and the axial extensions. In this case, a relatively small structural platform can be used. It is also possible, independently of the axial extensions and recesses, to provide that the first structures and the second structures are produced layered along the direction of axial extension.

A variant is also provided in which the second structure is completely or primarily produced from a superconducting material, such as NbTi. The superconducting materials can be melted and grown under highly controlled conditions; high current-carrying capacities are possible, such as filaments (extensions). Suitable superconducting materials are primarily metallic superconductors or low-temperature superconductors.

In another variant, the second structure is completely or primarily produced from aluminum or copper. In this variant, normally conductive conductor structures of high purity can be produced, for example as filaments (extensions).

Another variant method is provided in which the first structure is completely or primarily produced from aluminum or copper or in which the first structure is completely or primarily produced from an alloy containing aluminum or copper. In this case, the first structure can serve as a stabilizing (normally conductive) matrix in a superconducting wire or another conductor structure.

In another variant, after the two structures have been inserted into each other to form the two-part structure, this structure is subjected to deformation that narrows the cross-section, such as one or a plurality of cold and/or hot deformation processes. For example, suitable deformation techniques include extrusion, rolling, or wire drawing. Using deformation to narrow (reduce) the cross-section, optionally with multiple intermediate bundling steps, it is possible to configure numerous and fine substructures, such as superconducting filaments. In addition, using deformation also makes it possible to compress the materials.

A variant is also provided in which the first structure and/or the second structure is/are subjected after layered production by selective laser melting or selective electron beam melting to a surface treatment, such as a roughness-reducing surface treatment, for example electropolishing. A roughness-reducing surface treatment allows better mutual contact between the first and second structures to be achieved after they are inserted one into the other. If applicable, cavities between the first structure and the second structure can be reduced or prevented. By means of electropolishing, material peaks can be largely removed in a simple manner. It is also possible to carry out coating as a surface treatment, for example by electroplating (galvanizing), particularly if the first and second structures are composed of the same material. If desired, the first and/or the second structure can be oversized after the laser melting or electron beam melting, and this excess size can be eliminated using a material-removing surface treatment in order to prepare for or allow insertion of the structures one into the other. It is also possible using a material-cladding surface treatment to reduce or eliminate excessive clearance between the first and second structures and thus prepare them for being inserted one into the other.

An at least two-part structure, such as a semifinished product for a superconducting wire produced according to an above method according to embodiments of the invention, also falls within the scope of the present invention embodiments. The at least two-part structure can be produced with high aspect ratios of the substructures obtained, wherein various materials can also be combined in simple fashion. For this purpose, the at least two-part structure can be configured as a conductor wire (including a superconducting wire) or a semifinished product.

Further advantages of the invention can be seen from the description and the drawings. According to aspects of the invention, the features mentioned above and explained in further detail below can also be used individually or in any desired combinations. The embodiments shown and described are not to be understood as constituting an exhaustive enumeration, but are representative in nature for describing the invention.

BRIEF DESCRIPTION OF THE DRAWINGS

Aspects of the invention are shown in the drawings and are explained in greater detail by examples. The figures, which are not to scale, show the following:

(FIG. 4C) insertion of the first and second structures into each other; (FIG. 4D) the two-part structure after this insertion; (FIG. 4E) the two-part structure after cutting off of the end plates; and (FIG. 4F) deformation of the two-part structure to narrow the cross-section;

DETAILED DESCRIPTION

Figure 1:
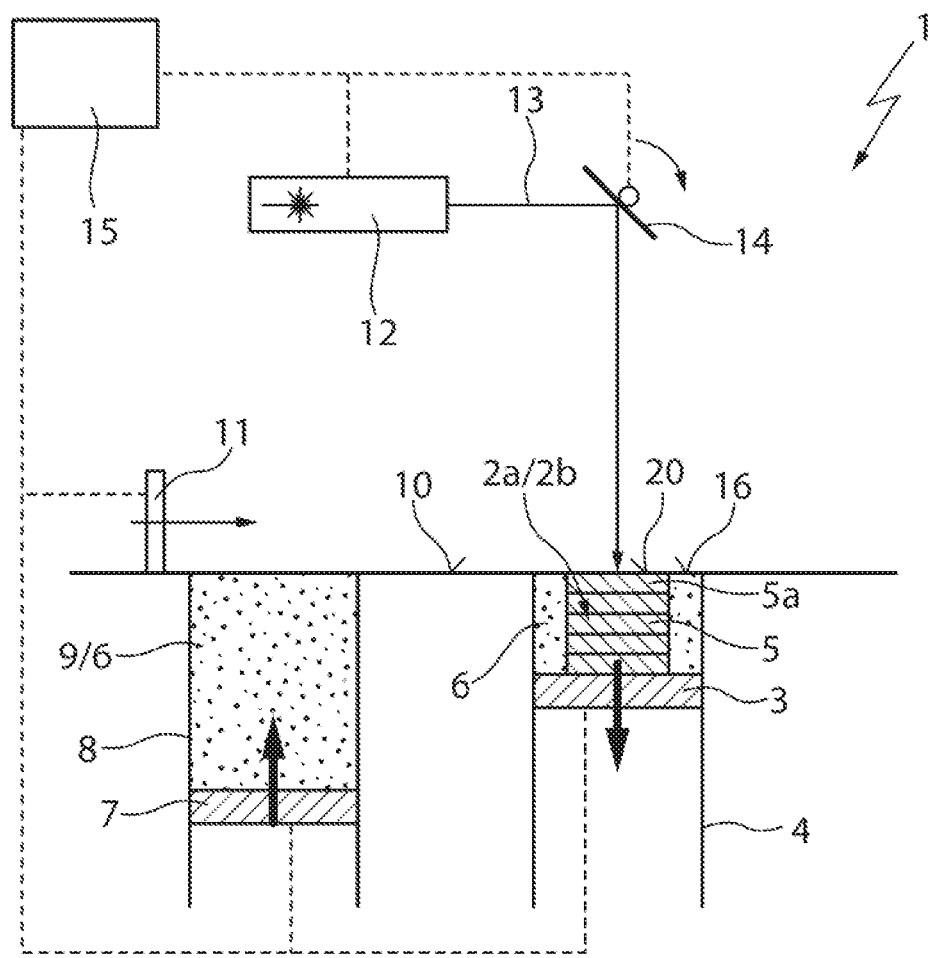
FIG. 1 is a schematic view of an apparatus for the layered production of a first and/or second structure by selective laser melting of a powder according to aspects of the invention.

FIG. 1 shows a schematic, partially cutaway view of an apparatus 1 for the layered production of first (partial) structures 2a and/or second (partial) structures 2b, using selective laser melting, according to embodiments of the invention. In particular, using apparatus 1, a first structure 2a and a second structure 2b can be produced successively, and these can then be assembled into an at least two-part (overall) structure. Alternatively, two apparatuses 1 can also be used, wherein a first of the apparatuses 1 produces the first structure 2a (or first structures 2a) and a second of the apparatuses 1 produces the second structure 2b (or second structures 2b).

The apparatus 1 comprises a structural platform 3 that is vertically displaceable in a guide 4. A partially produced structure 2a/2b, several layers 5 of which have already been produced, is arranged on the structural platform 3.

A reservoir 9 with powder (pulverulent material) 6 is further provided, wherein a powder bottom plate 7 is vertically displaceable in a guide 8. By raising the powder bottom plate 7, a small amount of pulverulent material 6 rises above the level of an apparatus bottom plate 10, so that this pulverulent material 6 can be brought via a horizontally displaceable slider 11 to the structural platform 3. In the example shown, the pulverulent material 6 is a mixture of elemental titanium and elemental niobium or a Cu powder.

A laser 12 is further provided, the laser beam 13 of which can be directed via a pivotable and/or displaceable mirror system 14 onto the entire surface of the structural platform 3.

The laser 12 (including the power thereof), the mirror system 14, the slider 11, the structural platform 3 and the powder bottom plate 7 can be automatically controlled via an electronic control device 15. The control contains CAD data on the structure to be produced 2a, 2b.

In order to produce a new, uppermost layer 5a of the structure 2a, 2b, the structural platform 3 is lowered by one layer thickness (usually approx. 25 µm-100 µm), the powder bottom plate 7 is moved somewhat upward, and using the slider 11, pulverulent material 6 is filled above the structural platform 3 and the partially produced structure 2a, 2b to the level of the apparatus bottom plate 10 and smoothed flat. The laser beam 13 or the reference point thereof then passes over an area (irradiated area) 20 provided in this layer 5a. The pulverulent material 6 is melted and solidified in this area. Ordinarily, a protective gas atmosphere (such as $N^2$, Ar, or a vacuum) is present at least around the uppermost layer 5a in order to prevent oxidation processes on the hot or molten material. The pulverulent material 6 remains loose in the non-irradiated area 16.

Figure 6:
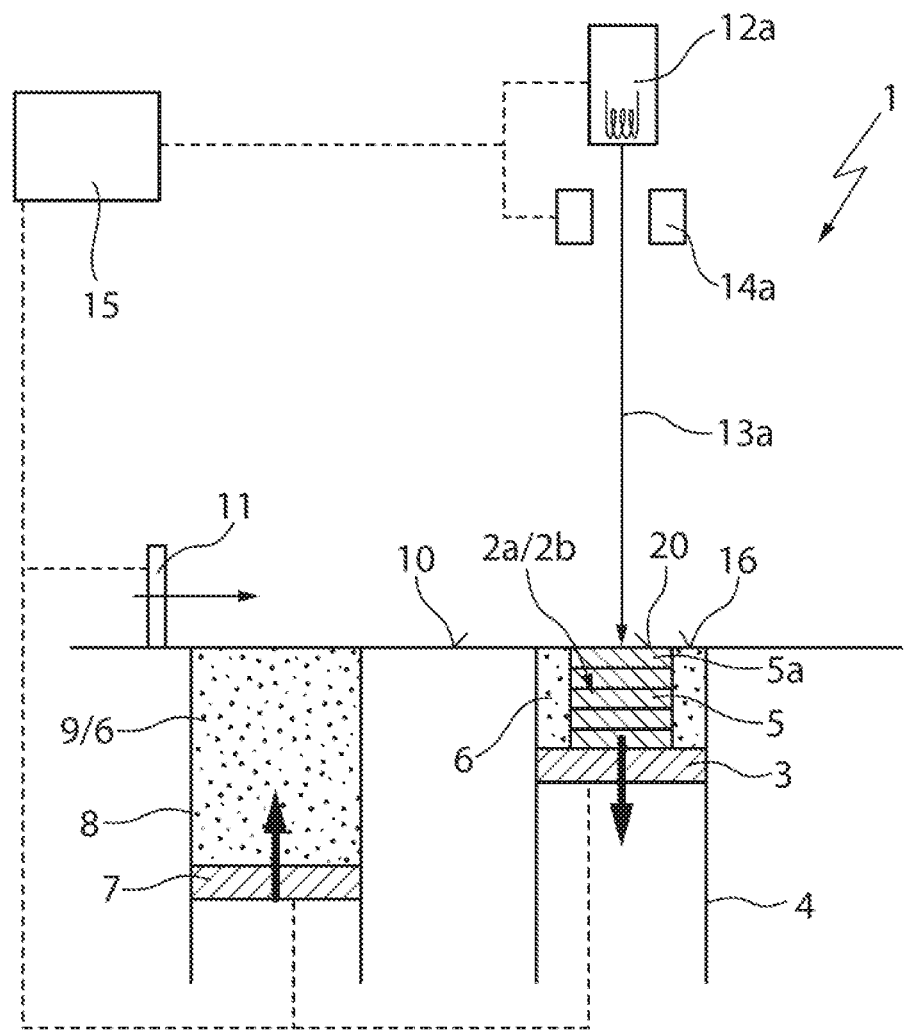
FIG. 6 is a schematic view of an apparatus for the layered production of a first and/or second structure by selective electron beam melting of a powder according to embodiments of the invention.

FIG. 6 shows an alternative apparatus 1 for the layered production of first (partial) structures 2a and/or second (partial) structures 2b, using selective electron beam melting, according to embodiments of the invention. As this apparatus 1 largely corresponds to the apparatus of FIG. 1, only the essential differences will be discussed here.

By means of an electron gun 12a, an electron beam 13a is produced that is deflected using a lens system 14a. The electron beam 13a scans the area provided in the uppermost layer 5a of the powder 6 on the structural platform 3. For this purpose, the electron gun 12a (and preferably the power thereof as well) and the lens system 14a are automatically controlled by the control device 15 in a corresponding manner. The energy of the electrons in the electron beam 13a causes the powder 6 in the irradiated area 20 to be melted and solidified. The electron beam 13a propagates in a vacuum.

Figure 2:
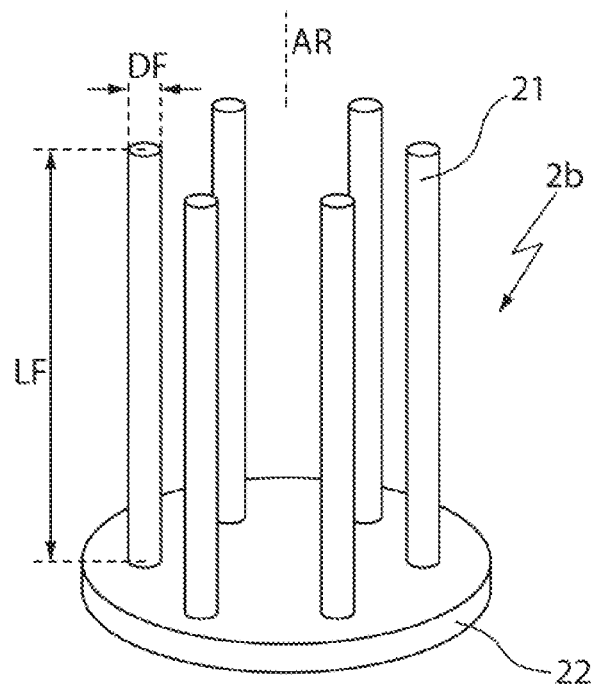
FIG. 2 is a schematic oblique view of an example of a second structure, according to aspects of the invention, shown with six axial extensions.

FIG. 2 shows an example of a second structure 2b produced according to embodiments of the invention, for example on an apparatus according to FIG. 1 or FIG. 6.

The second structure 2b comprises a plurality of (shown as six) axial extensions 21 that extend in an axial direction (longitudinal direction, extension direction) AR. The extensions 21 sit on an end plate 22 that typically serves as a structural plate (substrate) during layered production and mechanically connects the extensions 21. The extensions 21 have an axial length LF and show an unchanging, circular, cross-section over the entire axial length LF. The (largest) diameter DF of the extensions 21 in this case is approx. $\frac{1}{10}$ of the length LF, resulting in an extensions-aspect ratio FAV of LF/DF=10. It should be noted that in many applications, an FAV of 20 or more is also configured.

Figure 3:
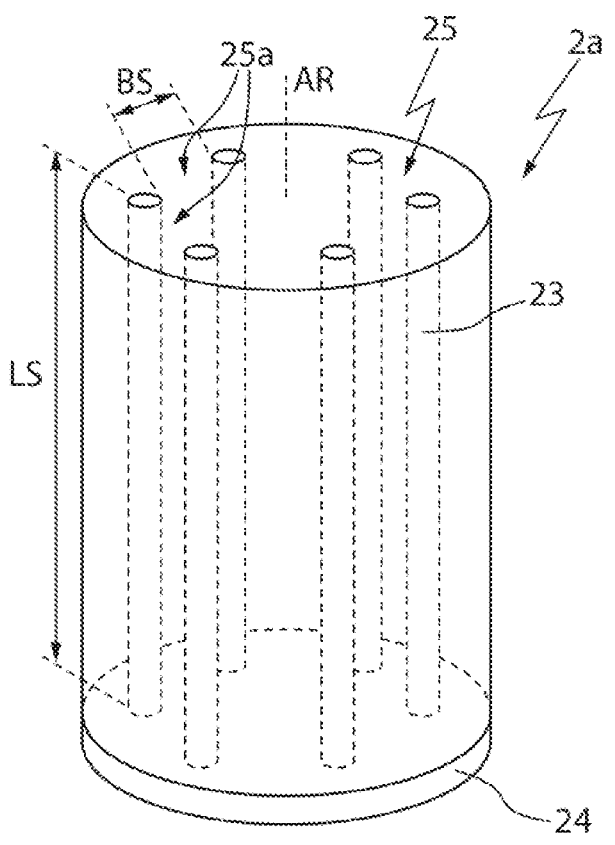
FIG. 3 is a schematic oblique view of an example of a first structure produced according to aspects of the invention, shown with six axial recesses, complementarily to the second structure of FIG. 2.

FIG. 3 shows an example of a first structure 2a produced according to the invention, for example on an apparatus according to FIG. 1 or FIG. 6.

In this case, the first structure 2a is essentially configured as a cylinder, wherein a plurality of (shown as six) axial recesses 23 is formed in the first structure 2a. The first structure 2a sits on an end plate 24 that typically serves as a structural plate (substrate) during layered production. The recesses 23, which in this case have a circular cross-section, are separated from one another, i.e. there is an axial projection area 25 remaining between the recesses 23. The space directly between two adjacent recesses 23 can also be referred to as a projection 25a. The projections 25a have an axial length LS and a (smallest) width BS; the (smallest) width BS of the projections 25a can also be referred to as the (smallest) distance between the recesses 23 in a direction transverse to the axial direction AR (longitudinal direction, extension direction). In this case, BS is approx. $\frac{1}{8}$ of LS, resulting in a projections-aspect ratio SAV of LS/BS=8. It should be noted that in many applications, an SAV of 20 or more is also configured.

The first structure 2a is configured to be complementary to the second structure 2b so that the extensions 21 of the second structure 2b can be inserted into the recesses 23 of the first structure 2a, without any noteworthy remaining cavities beyond the clearance necessary for insertion, and without requiring that the end plates 22, 24 be removed. The length LF of the axial extensions 21 essentially corresponds to the length of the axial recesses 23 or the length LS of the projections 25a.

FIGS. 4A through 4F illustrate the production of a two-part (overall) structure according to aspects of the invention in further detail.

Figure 4A:
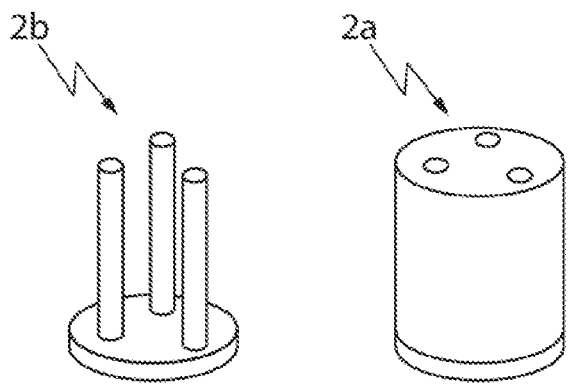
FIGS. 4A-4F schematically illustrate the flow of production of a two-part structure according to embodiments of the invention, showing (FIG. 4A) the first and second structures after layered production by selective laser melting or electron beam melting, (FIG. 4B) electropolishing of the first and second structures.

First, FIG. 4A shows an example of a first structure 2a and a complementary second structure 2b after they have been separately produced in a layered manner respectively by means of laser melting or electron beam melting, for example using the apparatus of FIG. 1 or FIG. 6.

Figure 4B:
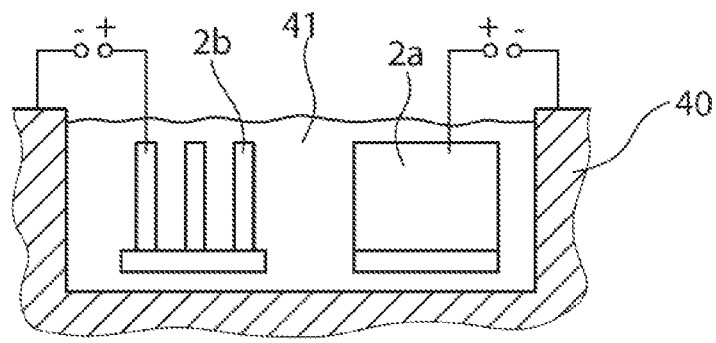

In order to minimize the roughness of the surface of the first structure 2a and the second structure 2b, the two structures 2a, 2b are then subjected to a surface treatment, in this case electropolishing, see, e.g., FIG. 4B. For this purpose, an electrical voltage is applied between the respective structures 2a, 2b and a surrounding electrolyte container 40, wherein the structures 2a, 2b are connected as anodes. In the electrolyte container 40, an electrolyte 41 is arranged (for example, an aqueous solution of phosphoric acid and/or sulfuric acid). At the roughness peaks, the electrical field strength is particularly high, causing the material of the structures 2a, 2b at these locations to dissolve particularly rapidly, which reduces the roughness. It should be noted that depending on the materials of the first and second structures 2a, 2b, different electrolytes 41 can or should also be used for the structures 2a, 2b, said process then typically taking place in separate electrolyte containers (not shown in further detail). Optionally, in the step illustrated in FIG. 4B, another and/or a different surface treatment, for example a surface treatment, e.g. a surface coating such as electroplating or spray coating, can also be carried out (not shown in further detail).

Figure 4C:
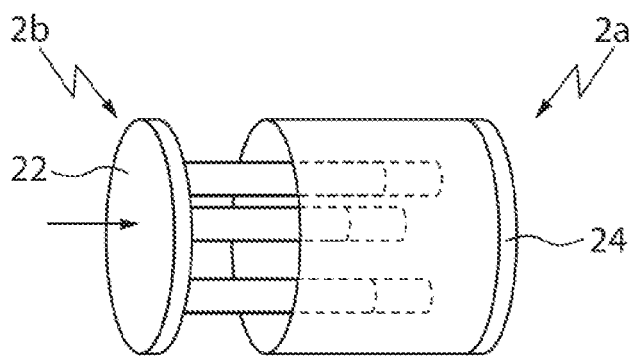

The two surface-treated structures 2a, 2b are then inserted into each other, as shown in FIG. 4C. At this point, the two structures 2a, 2b typically still have their end plates 22, 24.

Figure 4D:
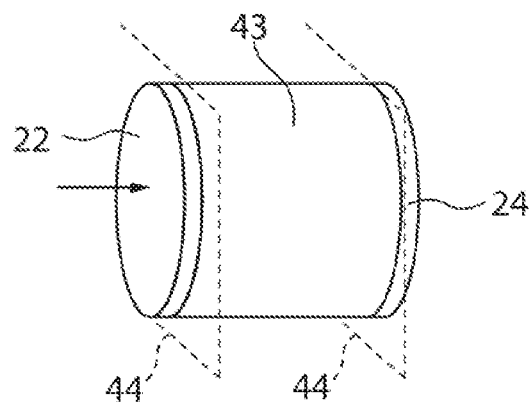

After assembly, there is a (shown here) two-part structure 43, also referred to as the overall structure, see, e.g., FIG. 4D. Typically, the end plates 22, 24 are cut off, see, e.g., the cut planes 44, typically with as small a proportion as possible of material of the overall structure 43. This cutting can be carried out, e.g., by sawing.

Figure 4E:
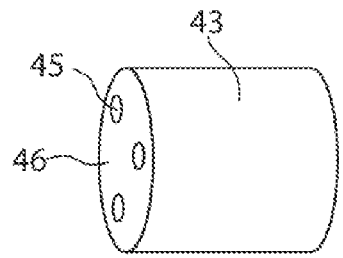

The remaining overall structure 43 comprises rod-shaped substructures 45 (filaments) of the material of the second structure, and furthermore has a surrounding matrix 46 of the material of the first structure, see, e.g., FIG. 4E.

Figure 4F:
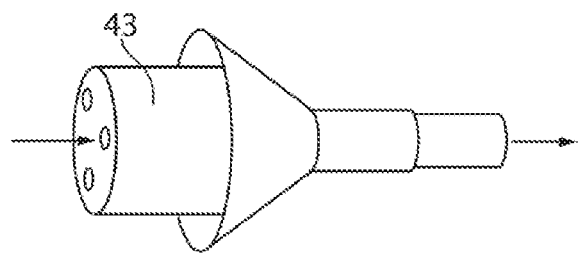

The overall structure 43 is then subjected to deformation that reduces the cross-section, such as extruding, see, e.g., FIG. 4F.

An overall structure obtained in this manner can serve for example as a semifinished product for a superconducting wire, typically with the rod-shaped substructures of a superconducting material such as NbTi and a matrix of a normally conductive metallic material such as Cu.

Figure 5A:
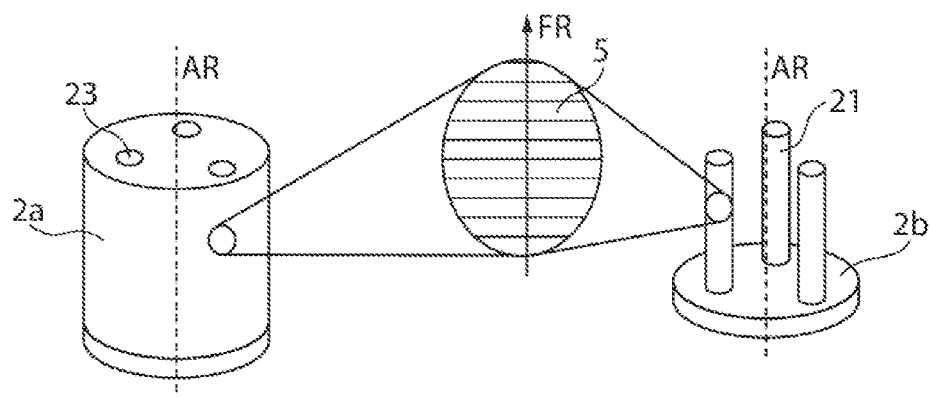
FIG. 5A is a schematic illustration of the production direction of the first and second structures along the direction of axial extension according to embodiments of the invention.

FIG. 5A shows a first structure 2a and a second structure 2b illustrating the orientation of the layers 5 in layered production along the axial direction (extension direction)

AR, compare the production direction FR. In this production direction FR, the successively produced layers 5 are perpendicular to the axial direction AR. This production direction FR is suitable and economical, particularly for relatively long axial structures 2a, 2b, as conventional structural platforms can be used.

Figure 5B:
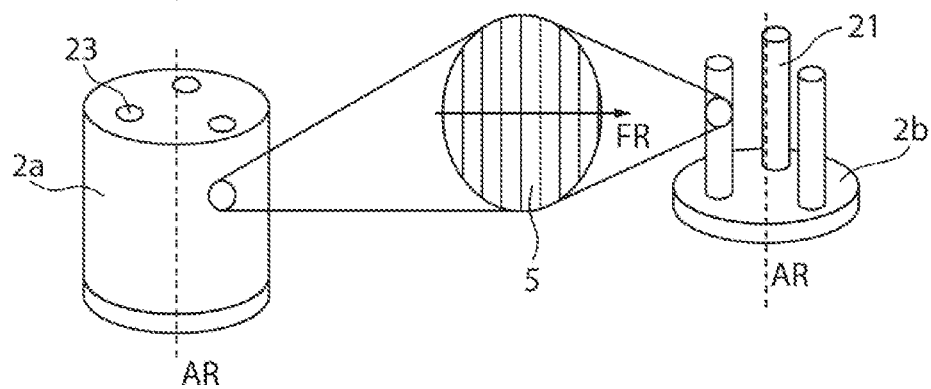
FIG. 5B is a schematic illustration of the production direction of the first and second structures perpendicular to the direction of axial extension according to embodiments of the invention.

FIG. 5B shows a first structure 2a and a second structure 2b illustrating the orientation of the layers 5 in layered production perpendicular to the axial direction (extension direction) AR, again with reference to the production direction FR. In this production direction FR, the successively produced layers 5 lie parallel to the axial direction AR. This production direction allows particularly high current-carrying capacities in the axial direction AR, for example in superconducting wires, but requires large structural platforms.

LIST OF REFERENCE SIGNS

1 Apparatus
2a First structure (partial structure)
2b Second structure (partial structure)
3 Structural platform
4 Guide
5 Layer
5a Uppermost layer
6 Powder/pulverulent material
7 Powder bottom plate
8 Guide
9 Reservoir
10 Apparatus bottom plate
11 Slider
12 Laser (laser source)
12a Electron gun
13 Laser beam
13a Electron beam
14 Mirror system
14a Lens system
15 Electronic control
16 Non-irradiated area
20 Irradiated area
21 Axial extension
22 End plate of the second structure
23 Axial recess
24 End plate of the first structure
25 Projection area
25a Projection
40 Electrolyte container
41 Electrolyte
43 At least two-part structure (overall structure)
44 Cut plane
45 Substructure (filament)
46 Matrix
AR Axial direction (longitudinal direction, extension direction)
BS Width projection
DF Diameter of axial extension
FAV Extensions-aspect ratio
FR Manufacturing direction
LF Axial length of extension
LS Axial length of projection/projection area
SAV Projections-aspect ratio

What is claimed is:

1. A method for producing an at least two-part structure comprising:
    separately producing a first structure and a second structure, wherein
    the first structure and the second structure respectively are produced in layers using selective laser melting or selective electron beam melting of a powder, and
    the first structure is produced with a plurality of axial recesses and the second structure is produced with a plurality of diametrically opposed axial extensions; and
    inserting the second structure into the first structure.

2. The method as claimed in claim 1, wherein the first structure is produced with at least 7 axial recesses and the second structure is produced with at least 7 diametrically opposed axial extensions.

3. The method as claimed in claim 2, wherein the first structure is produced with at least 19 axial recesses and the second structure is produced with at least 19 diametrically opposed axial extensions.

4. The method as claimed in claim 1, wherein the second structure is completely or primarily produced from a superconducting material.

5. The method as claimed in claim 4, wherein the superconducting material is NbTi.

6. The method as claimed in claim 1, wherein the two-part structure, after the second structure is inserted into the first structure, is subjected to deformation processes that narrow a cross-section of the two-part structure.

7. The method as claimed in claim 6, wherein the deformation processes comprise one or a plurality of cold and/or hot deformation processes.

8. The method as claimed in claim 1, wherein the first structure and/or the second structure, after layered production using the selective laser melting or the electron beam melting, are subjected to surface treatment.

9. The method as claimed in claim 8, wherein the surface treatment is a roughness reducing surface treatment.

10. The method according to claim 9, wherein the roughness reducing surface treatment is electropolishing.

11. The method as claimed in claim 1, wherein the first structure and the second structure are produced from different materials.

12. The method as claimed in claim 1, wherein the axial extensions of the second structure have an extensions-aspect ratio FAV of at least 20.

13. The method as claimed in claim 1, wherein an axial projection area of the first structure in which the axial recesses are configured has a projections-aspect ratio SAV of at least 20.

14. The method as claimed in claim 1, wherein the first structure and the second structure are produced layered along a direction (FR) perpendicular to a direction of axial extension (AR) of the axial recesses and the axial extensions.

15. The method as claimed in claim 1, wherein the first structure and the second structure are produced layered along a direction of axial extension (AR) of the axial recesses and the axial extensions.

16. The method as claimed in claim 1, wherein the second structure is completely or primarily produced from aluminum or copper.

17. The method as claimed in claim 1, wherein the first structure is completely or primarily produced from aluminum or copper, or wherein the first structure is completely or primarily produced from an alloy containing aluminum or copper.

18. The method as claimed in claim 1, wherein the at least two-part structure is a semifinished product for a superconducting wire.

19. The method as claimed in claim 1, wherein the second structure inserted into the first structure forms an overall structure with end plates of the first and the second structure, and said method further comprises cutting off the end plates from the overall structure.

* * * * *